United States Patent [19]
Johnson

[11] Patent Number: 5,634,801
[45] Date of Patent: Jun. 3, 1997

[54] ELECTRICAL INTERCONNECT CONTACT SYSTEM

[75] Inventor: David A. Johnson, Wayzata, Minn.

[73] Assignee: JohnsTech International Corporation, Minneapolis, Minn.

[21] Appl. No.: 362,206

[22] Filed: Dec. 22, 1994

Related U.S. Application Data

[63] Continuation-in-part of Ser. No. 56,677, May 3, 1993, Pat. No. 5,388,996, which is a continuation-in-part of Ser. No. 801,694, Dec. 2, 1991, Pat. No. 5,207,584, which is a continuation of Ser. No. 639,126, Jan. 9, 1991, Pat. No. 5,069,629.

[51] Int. Cl.$^6$ ............................................. H01R 9/09
[52] U.S. Cl. ............................................. 439/71
[58] Field of Search ............................ 439/66, 68, 70, 439/71, 74, 591

[56] References Cited

U.S. PATENT DOCUMENTS

| | | | |
|---|---|---|---|
| 3,551,750 | 12/1970 | Sterling | 317/101 |
| 3,795,037 | 3/1974 | Luttmer | 29/628 |
| 4,150,420 | 4/1979 | Berg | 361/401 |
| 4,295,700 | 10/1981 | Sado | 339/61 M |
| 4,330,165 | 5/1982 | Sado | 339/59 M |
| 4,402,562 | 9/1983 | Sado | 339/61 M |
| 4,445,735 | 5/1984 | Bonnefoy | 339/17 M |
| 4,477,774 | 10/1984 | Revirieux | 324/158 P |
| 4,506,938 | 3/1985 | Madden | 339/17 CF |
| 4,509,099 | 4/1985 | Takamato | 361/413 |
| 4,511,197 | 4/1985 | Grabbe et al. | 339/17 CF |
| 4,593,961 | 6/1986 | Cosmo | 339/61 M |
| 4,598,246 | 7/1986 | Staples et al. | 324/73 PC |
| 4,633,175 | 12/1986 | Ritchie et al. | 324/158 F |
| 4,634,199 | 1/1987 | Anhalt et al. | 339/17 M |
| 4,664,458 | 5/1987 | Worth | 339/17 M |
| 4,686,467 | 8/1987 | DeLapp et al. | 324/158 F |
| 4,793,814 | 12/1988 | Zifcak et al. | 439/66 |
| 4,800,335 | 1/1989 | Davila et al. | 324/158 F |

(List continued on next page.)

FOREIGN PATENT DOCUMENTS

| | | |
|---|---|---|
| 0431566A1 | 12/1991 | European Pat. Off. |
| WO897/04568 | 7/1987 | WIPO |

OTHER PUBLICATIONS

Electronic Design, "New Methods Vie for Dense, Fast Connector Slots", Lyman, May 11, 1989, pp. 71–74.

Test & Measurement World, "Fixturing for High–Speed Test Signals", Corwith, Nov. 1990, pp. 45–48.

(List continued on next page.)

*Primary Examiner*—Neil Abrams
*Attorney, Agent, or Firm*—Nawrocki, Rooney & Sivertson, P.A.

[57] ABSTRACT

A connector for electrically interconnecting a lead of a device to a terminal spaced at a distance from the lead. The apparatus includes a housing which has a slot to receive one of each of the one or more contacts. The contact-receiving slot extends substantially parallel to an axis which extends between a corresponding lead and spaced terminal. The housing has a first trough formed therein proximate the lead and a second trough formed therein proximate the spaced terminal. A first elastomeric element is received in the first trough formed in the housing, and a second elastomeric element is received in the second trough formed in the housing. The first and second elastomeric elements have a measure of compressibility and tensile extendibility. A contact is received within each slot. Each contact provided has a protrusion which extends outward from the surface of the housing to be engaged by the lead to which it corresponds. Each contact also has a hub which extends outward from the surface to engage the corresponding spaced terminal. Each contact also has first and second hook portions, the first hook portion being disposed proximate the contact protrusion and encircling the first elastomeric element to hold the contact to the first elastomeric element, and the second hook portion being disposed proximate the contact nub and encircling the second elastomeric element to hold the contact to the second elastomeric element.

12 Claims, 6 Drawing Sheets

U.S. PATENT DOCUMENTS

| | | | |
|---|---|---|---|
| 4,835,464 | 5/1989 | Slye et al. | 324/158 F |
| 4,866,374 | 9/1989 | Cedrone | 324/158 F |
| 4,870,353 | 9/1989 | Cook | 324/158 F |
| 4,929,892 | 5/1990 | Larsen | 324/158 F |
| 4,943,768 | 7/1990 | Niki et al. | 324/158 F |
| 4,950,980 | 8/1990 | Pfaff | 439/296 |
| 4,998,886 | 3/1991 | Werner | 439/66 |
| 5,069,629 | 12/1991 | Johnson | 439/71 |
| 5,137,456 | 8/1992 | Desai et al. | 439/66 |
| 5,139,427 | 8/1992 | Boyd et al. | 439/247 |
| 5,207,584 | 5/1993 | Johnson | 439/66 |
| 5,336,094 | 8/1994 | Johnson | 439/62 |
| 5,388,996 | 2/1995 | Johnson | 439/65 |

OTHER PUBLICATIONS

Surface Mount Technology, "SMT Market Trends", Stout, Nov. 1990, p. 4.

EDN, "Designs Meet Needs of High–Speed, High–Density Systems", Ormond, Jul. 5, 1990, pp. 50–58.

The Electronic System Design Magazine, "Packaging Standards: The Calm Before the Storm", Furlow, May 1989, pp. 24–26.

Connection Technology, "Testing a High–Rel Decoupling Capacitor Socket", Gallotello, Apr. 1990, pp. 39–40.

Technical Information, Decoupling: 256K DRAMS, Martin, AVX Corporation.

EMC Technology & Interference Control News, "The Role of Integrated Circuits Decoupling in Electromagnetic Campatibility", Johnston, Oct. 1983.

High Performance Decouping Capacitor for Installation Under the Dual in Line IC Package, Hyslop et al., Rogers Corporation.

Test & Measurement World, "Meeting the Electrical Challenges of IC–Handler Contractor Design", Roblee, Sep. 1989, pp. 46–50.

Electronic Packaging & Production; "Take a Look at Socketing", Hursh, Jun. 1989, pp. 56–60.

"Enhanced Performance Implanted CMOS (EPIC™) Advanced CMOS Logic (ACL) Design Considerations", Weinstein et al., Texas Instruments.

ELECTRICAL INTERCONNECT CONTACT SYSTEM

CROSS-REFERENCE TO RELATED APPLICATION

This is a continuation-in-part of application Ser. No. 08/056,677 filed on May 3, 1993, which issued as U.S. Pat. No. 5,388,996 on Feb. 14, 1995, which is a continuation-in-part of Ser. No. 07/801,694 filed on Dec. 2, 1991, which issued as U.S. Pat. No. 5,207,584 on May 4, 1993, which is a continuation of Ser. No. 07/639,126 filed on Jan. 9, 1991, which issued as U.S. Pat. No. 5,069,629 on Dec. 3, 1991.

TECHNICAL FIELD

The present invention deals broadly with the field of electrical interconnect systems. More narrowly, however, the invention is related to technology, for example, for interconnecting the leads of an integrated circuit device with corresponding terminals on a printed circuit board interfacing with a tester intended to effect test analysis of the integrated circuit device. The preferred embodiment of the invention is directed to contacts and means for mounting the contacts for effecting such interconnection.

BACKGROUND OF THE INVENTION

A plethora of applications exist for effecting electrical contact between two conductors. One significant application is effecting interconnection between the leads of an integrated circuit device and conductive pads or terminals on a printed circuit board which serves to effect an interfacing between the integrated circuit (IC) device and a tester apparatus. Such apparatus are used to evaluate performance of integrated circuit devices.

Numerous considerations bear upon the structure employed to interconnect the IC and the printed circuit board. These factors both include electrical and mechanical considerations.

One prior art structure which seeks to accomplish the purpose of the present invention is known as the Yamaichi contact. This type of contact includes an inverted L-shaped support having a cantilevered contacting portion mounted at the distal end of the generally horizontal leg of the inverted, L-shaped support, and extending generally parallel to that leg. The distal end of the contacting portion is upwardly turned so that a point thereof is engageable by a lead of an integrated circuit device to be contacted. The support, in turn, is engaged in some manner with or through a pad or terminal portion of a printed circuit board.

One of the mechanical considerations to be taken into account in designing an interconnect system is that a wiping action should be accomplished between the contact itself and the lead of the IC by which the contact is engaged. The wiping action functions to effect maximization of effective contact in view of oxide build-up which can occur. In effect, the wiping action enables a good interface to be accomplished between the contact and the lead of the IC.

In view of the fact that the cantilevered portion of the Yamaichi contact has some measure of flexibility, a wiping action can be accomplished. Another mechanical consideration that must be taken into account, however, is the desire to deter bending of the lead on the IC. The Yamaichi contact does not fully accomplish this goal.

Finally with respect to mechanical considerations, it is desirable that wiping action can be accomplished at the interface between the second end of the contact and the printed circuit board. In view of the construction of the Yamaichi contact, it is precluded from allowing such wiping action at the lower end of the contact.

Further, the Yamaichi device does not sufficiently consider the electrical dictates for an interconnecting contact system. An interconnecting contact should be a high speed, short path device. Derivatively, such a contact should have a low inductance without having a controlled impedance requirement. Because of the construction of the Yamaichi contact, it does not adequately satisfy these requirements.

U.S. Pat. No. 4,445,735 which issued on May 1, 1984 illustrates another type of electrical connection device. The device of that patent serves to establish an electrical connection between contacts of a circuit network on a substrate and contact pads of a conductor network on a printed circuit board. This device is an improvement over the Yamaichi contact in that it is higher in speed and lower in inductance than the Yamaichi device. It has elastomeric means for mounting one or more contacts in a housing. The elastomeric biasing and mounting enables wiping action to be effected at both upper and lower ends of the contact. That is, both the end which engages an IC lead and the end which engages a printed circuit board contact pad can be wiped across the surfaces intended to be contacted.

The device of the '735 patent, however, retains some limitations. While some wiping action is afforded at both upper and lower ends of the contact, the amount of such wiping action is relatively limited because of the elastomeric elements being used generally for effecting biasing rather than free floating suspension of the contacts. As a result of the mounting means incorporated in the '735 patent, there will be a primary tendency for some retraction of the contact point in a generally vertical direction, but there will be only a small component of lateral movement to effect wiping. Additionally, because of the lack of any significant free floating effect, lead bending on an integrated circuit being tested can occur.

It is to these dictates and shortcomings of the prior art that the present invention is directed. It is an improved electrical interconnecting system which addresses the dictates of the prior art and resolves problems thereof.

SUMMARY OF THE INVENTION

The present invention is an assembly which functions to electrically interconnect a lead of an integrated circuit device to a terminal, for example, of a printed circuit board, spaced at a distance from the corresponding lead of the integrated circuit. The assembly includes a housing which is interposed between the lead of the integrated circuit and the corresponding spaced terminal. The housing is provided with at least one slot, extending either partially or fully therethrough from a first surface to an oppositely facing second surface. The one or more slots extend substantially parallel to an axis along which corresponding integrated circuit lead and spaced terminal are aligned.

The first surface of the housing has, formed therein, a trough proximate the location of the integrated circuit lead, and the second surface of the housing has, formed therein, a similar trough, the trough in the second surface being disposed proximate the spaced terminal corresponding to an integrated circuit lead.

A rigid first element is received in the trough formed in the first surface and extends across any slots in which one or more contacts are received. An elastomeric second element is received in the trough formed in the second surface of the housing and extends across the one or more slots in which contacts are received. The elastomeric second element is provided with a measure of compressibility and tensile extendibility.

A generally planar contact is received within one or more of the slots, each contact having a protrusion extending outward from the first surface of the housing to be engaged by an integrated circuit lead. Each contact also has a nub normally extending outward from the housing toward the second surface of the housing to engage a corresponding spaced terminal. Further, each contact has a hook portion proximate the nub of the contact, the hook portion encircling the elastomeric second element to hold the contact to the elastomeric second element.

Each contact has formed therein an elongated channel to receive the rigid first element therein for relative movement of that element along the channel. Relative movement results as the protrusion of the contact is engaged by, and urged inwardly into the housing by, an integrated circuit lead. The assembly functions to create a wiping action, as a result of the rigid first element moving relatively along the channel formed in the contact, wherein the protrusion of the contact moves across the integrated circuit lead by which it has been engaged, and the nub of the contact moves across the corresponding spaced terminal of the printed circuit board.

In one embodiment of the invention wherein the trough formed in the first surface of the housing is substantially symmetrical with respect to a plane normal to the first surface, an axis of elongation of the channel formed in each of the contacts is at an angle relative to such a plane. Typically in this embodiment, the trough formed in the second surface of the housing is laterally offset from that formed in the first surface. As a particular lead of an integrated circuit device engages the protrusion of a corresponding contact and exerts downward pressure upon the protrusion, the channel in the contact will move relatively to the rigid first element received therein, and the contact will, effectively, be made to rotate to some extent as a result of the rigid first element moving, relative to the contact, more deeply into the channel formed in the contact.

The downward force exerted by the lead of the integrated circuit upon the contact will have components along both X and Y axes, and these components will effect the apparent rotation of the contact. As a result, the protrusion will move laterally to some degree across the surface of the integrated circuit lead by which it is engaged, and the hub of the contact will move laterally across the integrated circuit board terminal with which it is in contact.

In another embodiment of the invention, a plurality of slots, each receiving a contact, are provided. Typically, a multiplicity of contacts are employed, one for each integrated circuit lead. In such an embodiment, the printed circuit board is provided with a plurality of terminals, each being in engagement with one of the ganged contacts.

In such a multiple contact embodiment, an additional elastomeric second element can be provided. The additional elastomeric second element being disposed in a second trough formed in the second surface of the housing and being symmetrical, with respect to the initial elastomeric second element, relative to the rigid first element. Contacts in immediately adjacent slots can be staggered (that is, alternately hooked to the initial elastomeric second element and the additional elastomeric second element). By providing such a structure twice the contacting density per unit length can be provided.

In this embodiment, a trough need not be provided to receive the rigid element. Since there are at least two oppositely-acting, cooperating contacts, the rigid element will be maintained within the channels of the contacts. Since the channels are angled in opposite directions, they will act as jaws to hold the rigid element in place.

Another embodiment employs an elastomeric elongated element in the trough formed in the first surface of the housing rather than a rigid element. This embodiment would employ a hook member proximate the protrusion of the contact at the upper end thereof rather than an elongated channel as in the first-described embodiment. The contact would, therefore, latch into the upper elastomeric element as it does onto the lower elastomeric element. In this embodiment, the contact is more free-floating than in the previously described embodiment.

Another embodiment of the present invention is directed to electrically interconnecting a lead of the device to a terminal spaced at a distance from the lead when both the lead and the spaced terminal are within the same planar surface. In this embodiment, the housing is similar to other embodiments, in that the housing has a slot formed therein extending substantially parallel to an axis extending between a corresponding lead and spaced terminal. However, the surface adjacent the slot has both a first trough formed therein proximate the lead and a second trough formed therein proximate the spaced terminal.

Elastomeric elements are received in each of the troughs for this embodiment. The contact received within the slot has both a hub extending outward from the surface for engagement of the spaced terminal and a protrusion extending outward from the same surface for engagement by the lead. The first and second elastomeric elements hold the contact in place, as previously disclosed.

In another embodiment of the present invention, a first trough formed in the first surface of the housing is substantially symmetrical with a second trough formed in the second surface of the housing. Typically in this embodiment, the second trough formed in the second surface of the housing is aligned with the first trough formed in the first surface. A first elastomeric elongated element may be positioned in the first trough formed in the first surface of the housing. Further, a second elastomeric elongated element may be positioned in the second trough formed in the second surface of the housing. It is contemplated that the second element may be constructed from a rigid material and still be within the scope of the present invention. A contact may have a first hook member near an upper portion of the contact and a second hook member near a lower portion of the contact. The first hook member may capture the first elastomeric element and the second hook member may capture the second elastomeric element.

The contact would, therefore, latch onto the first elastomeric element and the second elastomeric element. The contact may have both a nub extending downward for engagement of the spaced terminal and a protrusion extending outward opposite the first hook member for engagement by the lead. The first and second elastomeric elements may hold the contact in place, as previously disclosed.

As a particular lead of an integrated circuit device engages the protrusion of a corresponding contact and exerts downward pressure upon the protrusion, the contact may move relative to the first elastomeric element and the second elastomeric element captured thereby, and the contact will, effectively, be made to rotate to some extent as a result of the first elastomeric element deforming laterally away from the lead of the integrated circuit. That is, the downward force exerted by the lead of the integrated circuit upon the contact will have components along both X and Y axes, and these components will effect the apparent rotation of the contact. As a result, the protrusion will move laterally to some degree across the surface of the integrated circuit lead by which it is engaged, and the nub of the contact will translate laterally across the integrated circuit board terminal with which it is in contact.

In another related embodiment, the contact may have an elongated nub extending downward from the second surface of the housing. An integrated circuit board terminal may be positioned to engage the side of the elongated nub opposite the first and second hook members. In this embodiment, as in the previously described related embodiment, the downward force exerted by the lead of the integrated circuit upon the contact will have components along both X and Y axes, and these components will effect the apparent rotation of the contact. As a result, the protrusion will tend to move laterally to some degree across the surface of the integrated circuit lead by which it is engaged. Further, the extended nub of the contact will move laterally with respect to the integrated circuit board terminal thereby applying increased force thereon. The apparent rotation of the contact will also cause the elongated nub to move somewhat vertically across the integrated circuit board terminal thereby providing a wiping action thereto.

In another embodiment of the present invention, the contact may have an elongated nub extending downward from the second surface of the housing as previously described. However, the integrated circuit board terminal may be positioned to engage the side of the elongated nub which is adjacent to the first and second hook members. Further, the protrusion on the contact may be positioned lower on the contact body such that the integrated circuit lead contacts the protrusion between the first and second elastomeric elements. In this embodiment, the downward force exerted by the lead of the integrated circuit upon the contact will have a component along primarily the X axis, and this component will effect the apparent lateral movement of the contact. As a result, the extended nub of the contact may move laterally with respect to the integrated circuit board terminal thereby applying increased force thereon.

It is contemplated that the elongated hub of the contact in the previously described embodiment may be replaced with a first nub and a second hub. The first nub and the second nub may extend downward from the second surface of the housing for engagement of a first integrated circuit board terminal and a second integrated circuit board terminal, respectively. As described above, the protrusion on the contact may be positioned lower on the contact body such that the integrated circuit lead contacts the protrusion between the first and the second elastomeric elements. In this embodiment, the downward force exerted by the lead of the integrated circuit upon the contact will have a component along primarily the X axis, and this component will effect lateral movement of the contact. As a result, the first nub and the second hub of the contact may move laterally with respect to the first integrated circuit board terminal and the second integrated circuit board terminal, respectively, thereby providing a wiping action thereto while maintaining contact therewith. This multi-contact embodiment may provide a means for programming a corresponding PC board by selectively using the multi-contact in combination with single-contacts. For example, the multi-contact configuration may be used to bridge two signal traces. A test board may be programmed by selecting a multi-contact when two corresponding traces are to be bridged and by selecting a single-contact when two corresponding contacts are not to be bridged. This allows a PC board to be customized by selecting the appropriate combination of multi-contacts and single-contacts, rather than providing a new PC board for each application. The multi-contact may also provide a more reliable contact.

In all of the previously described embodiments, a plurality of slots, each receiving a contact, may be provided. Typically, a multiplicity of contacts are employed, one for each integrated circuit lead. In such an embodiment, the printed circuit board is provided with a plurality of terminals, each being in engagement with one of the ganged contacts.

The present invention is thus an electrical contact interconnecting system improved over systems of the prior art. More specific features and advantages obtained in view of those features will become apparent with reference to the DETAILED DESCRIPTION OF THE INVENTION, appended claims, and accompanying drawing figures.

DETAILED DESCRIPTION OF THE INVENTION

Figures 1, 2, 3, 4:
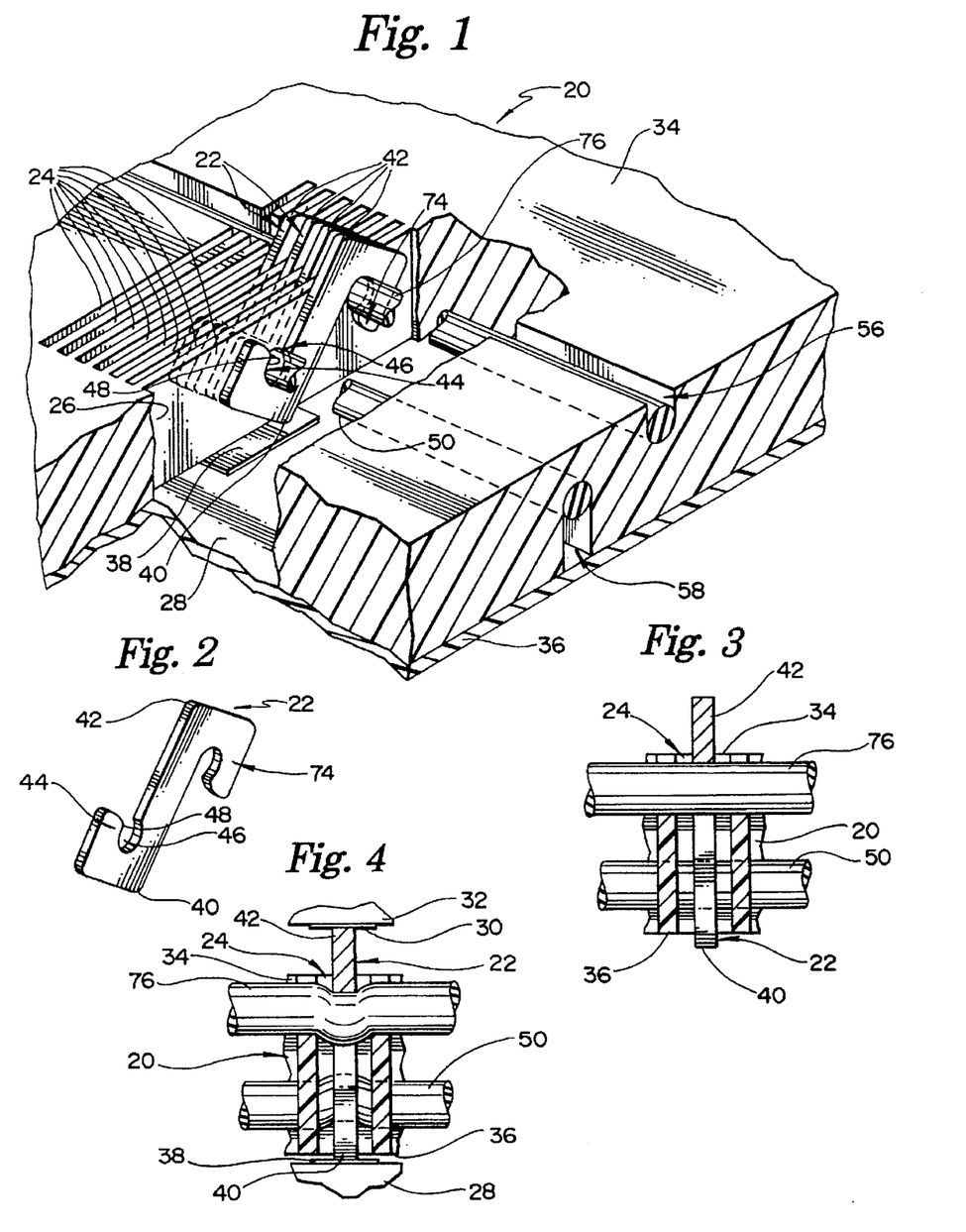
FIG. 1 is an enlarged fragmentary perspective view of one embodiment of the present invention illustrating plural contacts.
FIG. 2 is a perspective view of an individual contact of the embodiment of FIG. 1.
FIG. 3 is a fragmentary functional diagram showing the embodiment of the invention of FIG. 1 sectioned vertically and at rest.
FIG. 4 is a view similar to FIG. 3 showing the contact engaged by an integrated circuit device lead.

Referring now to the drawings wherein like reference numerals denote like elements throughout the several views, FIG. 1 illustrates a housing 20 suspending a plurality of contacts 22 in accordance with the present invention. The housing 20 shown in FIG. 1 is representative of a housing usable in virtually all embodiments of the invention, although, in some embodiments, some variations, generally unrelated to contact mounting, could be incorporated.

Some portions of the housing 20 are broken away in FIG. 1, but one viewing the figure can count at least seven slots 24 formed through the housing 20. The rightmost of the slots 24 is sectioned so that only one side wall 26 of the slot 24 is able to be seen.

While seven slots 24 are illustrated, only four contacts 22 are shown as being disposed in slots 24. It will be understood, however, that, typically, a contact 22 would be suspended within the housing 20 in each slot 24 provided, although this would not be essential. Additionally, it will be understood that any number of slots 24 could be provided, and the slots 24 could be organized in multiple arrays. For example, four arrays of slots 24 defining a quadrilateral form could be employed. Such a configuration would be employed when the housing 20 in accordance with the present invention is intended to interconnect a printed circuit board 28, interfacing with a tester mechanism (not shown), to the leads 30 of, for example, of a leadless chip carrier integrated circuit device 32. FIG. 1, therefore, is merely illustrative of a rudimentary housing 20 in accordance with the invention. As seen in FIG. 1, the rightmost slot 24 is shown as extending fully through the vertical dimension of the housing 20 from a first, upwardly facing surface 34 of the housing 20, to a second downwardly facing surface 36 of the housing 20. The same is true of each slot 24.

The second surface 36 of the housing 20 is shown as being in engagement with a printed circuit board 28 having at least one pad or terminal 38 traced thereon. Such a pad 38 is intended to be engaged by a nub 40 at the lower end of the contact 22 as will be discussed hereinafter. In view of the fact that the nub 40 is biased to extend outwardly at least to the second surface 36 of the housing 20, when the printed circuit board 28 is held in position in engagement with the second surface 36 of the housing 20, the nub 40 of the contact will, in fact, engage the pad 38 if the pad 38 is properly positioned spatially.

Figures 5, 6:
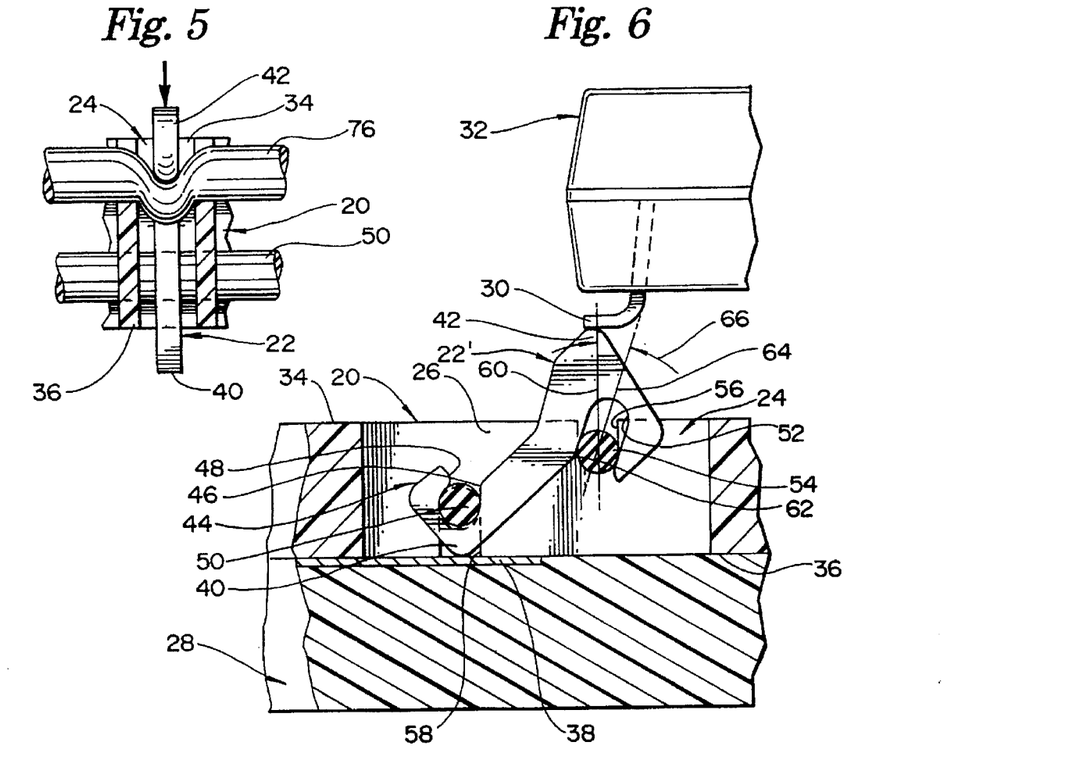
FIG. 5 is a view similar to FIG. 3 showing the contact being manipulated in order to effect connection or disconnection to the rigid and elastomeric members.
FIG. 6 is a fragmentary side elevational view of another embodiment of the invention with some parts cut away.
Figure 7:
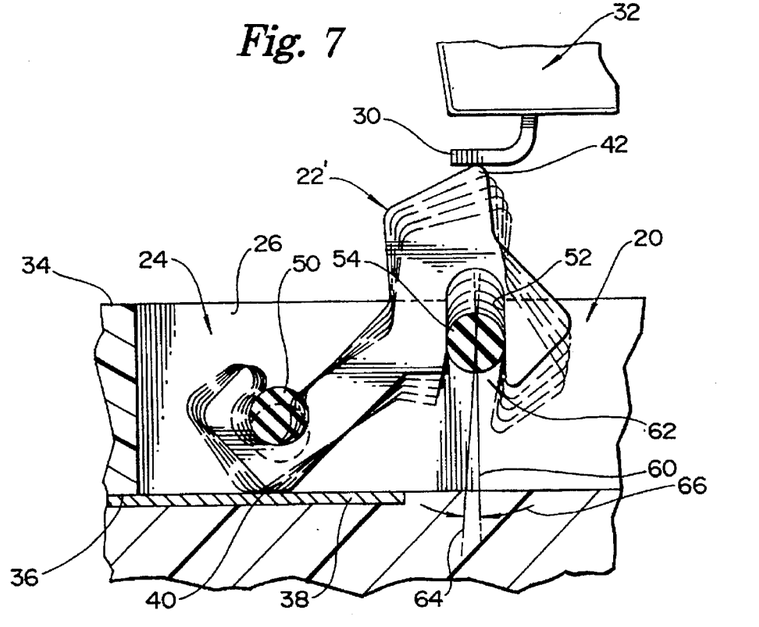
FIG. 7 is an enlarged view similar to FIG. 6 showing articulation of a contact in dashed lines.

FIGS. 6 and 7, to which further reference will be made in describing the embodiment thereof, show a contact 22' suspended in a housing 20 in a manner discussed hereinafter. The contact 22' has a small measure of elongation and has a protrusion 42 at its upper end, the protrusion 42 functioning to be engaged by a lead 30 from an integrated circuit device 32 intended to be interconnected to the printed circuit board 28. As seen in FIG. 6 and 7, when the contact 22' is suspended by the housing 20, the protrusion 42 extends upwardly beyond the first surface 34 of the housing 20.

As previously discussed, the contact 22' has, at its lower end, a nub 40. The nub 40 is, of course, intended to engage the terminal or pad 38 on the printed circuit board 28 which corresponds to a particular integrated circuit lead 30 engaged by the protrusion 42 of the respective contact 22.

Proximate the nub 40 is a hook portion 44 of the contact 22'. The hook portion 44 defines a generally circular aperture 46 which is pinched at the entry thereto, as at 48, so that, when the hook portion 44 is urged over an elastomeric element 50 as defined hereinafter, the contact 22' will be maintained in a position suspended with respect to the elastomeric element 50.

The contact 22', proximate its upper protrusion end, is provided with an elongated channel 52. This channel 52 is intended to receive a rigid element 54 as defined hereinafter.

Referring now again to FIG. 1 which illustrated a representative housing 20, the first surface 34 of the housing 20 is provided with a trough 56, that trough 56 extending across, and generally transverse to, the plurality of slots 24. In a like manner, the second surface 36 of the housing 20 also has a trough 58 formed therein. This trough 58 also extends across the various slots 24 and is illustrated as being generally transverse to the direction of orientation of the slots 24. Each trough 56, 58 is shown as being generally symmetrical with respect to an imaginary plane 60 that would be perpendicular to the respective surface in which the trough 56, 58 is formed. It will also be noted that the troughs 56, 58 are laterally offset from one another for a purpose that will become apparent in view of subsequent discussion.

The trough 56 formed in the first surface 34 is intended to accept the rigid element 54 in the case of the embodiment of FIGS. 6 and 7. The element 54 is shown as extending fully across the array of slots 24 across which the trough 56 in which the element 54 is received extends.

In that embodiment, the trough 58 formed in the second surface 36 of the housing 20 is intended to accept a compressible, tensile extendable, elastomeric element 50 therein. In the case of the rigid element 54 received in the trough 56 formed in the first surface 34 of the housing 20, the elastomeric element 50 received in the trough 58 formed in the second surface 36 of the housing 20 is intended to extend fully across the array of slots 24 across which the trough 58 in which the elastomeric element 50 is received extends.

Mounting, or suspension, of individual contacts 22' in the embodiment of FIGS. 6 and 7 can be effected in any appropriate manner. One simple manual way of effecting suspension would be to insert the contact 22' downwardly through the slot 24 within which it is to be received by urging the hub 40 end between the rigid element 54 and the elastomeric element 50, those two members having been received within their respective troughs 56, 58. Once the hook portion 44 has been inserted to a point at which it has achieved a location below the elastomeric element 50, the hook portion 44 can be moved laterally to "catch" the elastomeric element 50 therewithin.

After such "catching" has occurred, the contact 22' would be withdrawn upwardly to a point at which the entrance to the elongated channel 52 in the contact 22' is above the upper edge of the rigid element 54. The protrusion end of the contact 22' can then be moved in a direction to the right, as viewed in FIGS. 6 and 7, until the entrance 62 to the channel 52 is above the rigid element 54. It will be understood that, as the contact 22' is withdrawn upwardly, the elastomeric element 50 will come under tension when the contact 22' is in a disposition wherein the entrance 62 to the channel 52 is above the rigid element 54. When the contact 22' is in such a disposition, the contact 22' can be eased downwardly so that the rigid element 54 enters the channel 52. The tension on the elastomeric element 50 will, thereby, be released, and the contact 22' will be in its "rest" position. This procedure can be performed for multiple contacts 22' when a gang or array of contacts 22' is employed.

The "rest" position of a contact 22' is represented in solid line in FIG. 7. The center-line axis 64 of the channel 52 is angled slightly to the right of a plane of symmetry 60 to the trough 56 within which the rigid element 54 is received. That plane of symmetry 60 is generally normal to the first surface 34 of the housing 20 and is represented by a dashed line. The center-line axis 64 of the channel 52 formed in the contact 22' is represented by an additional line 64 in FIG. 7 at a slight angle with respect to the line representing the plane of symmetry 60 of the trough 56. An angle representation 66 indicates the angle at which the channel 52 is tilted from the plane of symmetry 60 of the trough 56. This angle 66 can be, in the "rest" position of the contact 22', quite small and probably, it is anticipated, of a magnitude of between about 3° and 30°.

FIG. 7 also illustrates the movement of a contact 22' as the protrusion 42 of the contact 22' is engaged by a lead 30 of an integrated circuit device 32. As the integrated circuit device 32 is brought into engagement with the protrusion engagement point and downward pressure continues, the rigid element 54 rides upwardly, relative to the elongated channel 52 in the contact 22', and the angle of offset 66 of the axis 64 of the channel 52 becomes more exaggerated. As this occurs, the engagement point of the protrusion 42 is moved downwardly and to the right. The rightward movement of the engagement point of the protrusion 42 will permit relative movement of the engagement point across the surface of the integrated circuit lead 30. This wiping action will provide for a better electrical flow path between the integrated circuit lead 30 and the protrusion 42 of the contact 22'.

One of the reasons why the apparent rotation of the contact 22' will occur is that the nub end of the contact 22' will be precluded from downward movement by the terminal or pad 38 of the printed circuit board 28. As previously discussed, in the embodiment illustrated in FIGS. 6 and 7, the printed circuit board 28 is substantially in engagement with the second surface 36 of the housing 22'. The vertical location of the deepest part of the trough 58 formed in the second surface 36 of the housing 20 relative to the dimensions of the lower portion of the contact 22' will provide for biasing of the hub 40 of the contact 22' into engagement with the printed circuit board pad 38. As the integrated circuit 32 urges the protrusion 42 of the contact 22' downwardly, therefore, the nub 40 will be driven in a direction to the left as viewed in FIG. 7. Wiping action will, thereby, occur, and the electrical flow path between the nub 40 of the contact 22' and the printed circuit board terminal 38 will be optimized.

Figure 8:
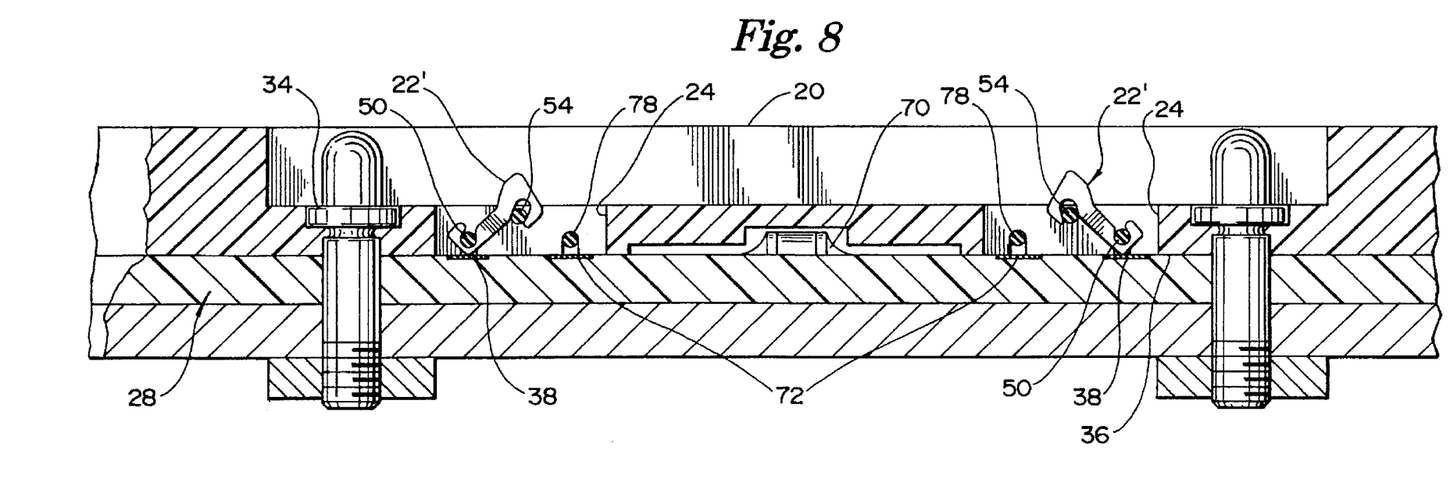
FIG. 8 is a fragmentary side elevational view with some parts cut away showing an embodiment of the invention in signal mode contact configuration.
Figure 9:
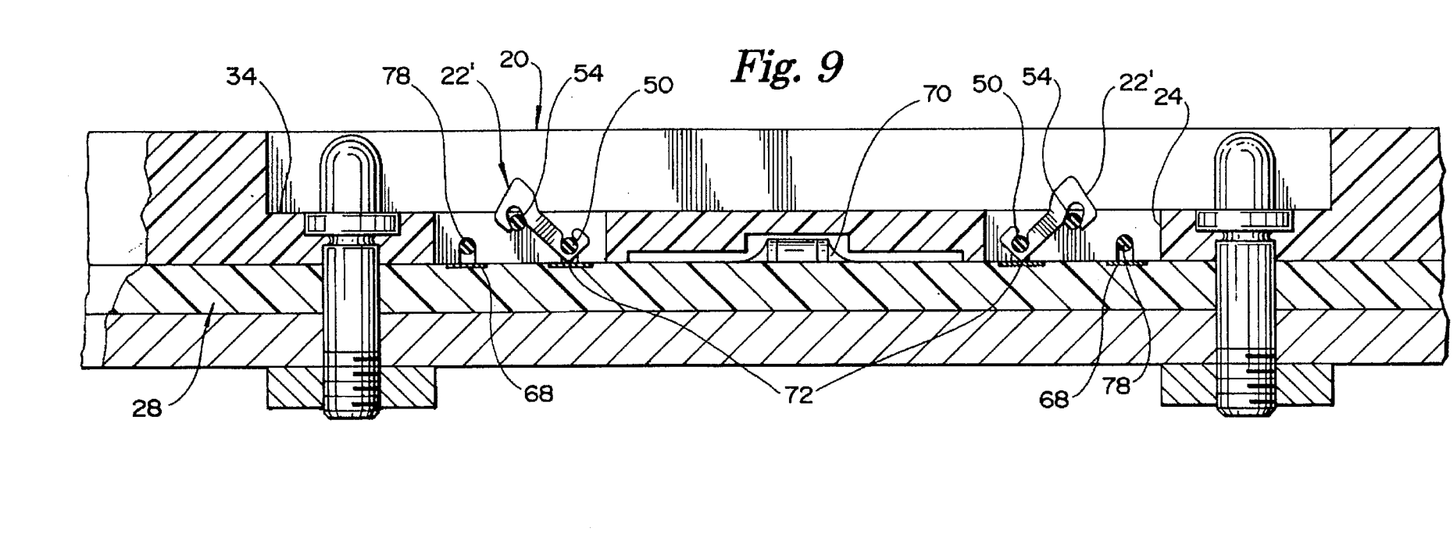
FIG. 9 is a view similar to FIG. 8 showing the embodiment in a decoupling mode contact configuration.

FIGS. 8 and 9 show contacts and contact suspension means as illustrated in FIGS. 6 and 7 to illustrate signal and decoupling modes of the housing 20. FIG. 8 illustrates the invention embodiment in a signal mode configuration. This view shows the contacts 22' configured to interface signal terminals or lands 68 on the printed circuit board 28.

FIG. 9 illustrates a decoupling mode. In the decoupling mode, the integrated circuit device 32 has multiple ground and, sometimes, multiple power leads which need to be connected by a capacitor 70 to allow current response when outputs of the integrated circuit device 32 are switched. In the prior art, the customer is assisted in meeting needs for specific device configurations of ground and power locations. These locations are virtually always located near the center of the sides, since the internal lead inductance is the smallest. The housing 20 is designed to permit center contacts to be mirrored to allow ground and power leads to directly contact one of multiple decoupling planes 72. Each decoupling plane 72 used is designated as either a ground or power plane so that, when a chip capacitor 70 is soldered across these planes 72, a decoupling circuit will be formed.

Both the signal terminals or lands 68 and the decoupling planes 72 are connected to external customer circuits. The contacts 22' are shown as mirrored to allow for direct integrated circuit electrical connection to the decoupling planes 72. The decoupling planes 72 are decoupled by a chip capacitor 70. The contacts 72 illustrated in FIGS. 1–5 are different than those illustrated in FIGS. 6–7. FIG. 2 illustrates an alternative form contact 22 isolated from a slot 24 within the housing 20. The primary difference between this contact 22 and that previously described is that the contact 22 does not have an elongated channel 52 proximate the upper protrusion portion. Rather, the contact 22 of FIGS. 1–5 is provided with a hook portion 74 similar to the hook portion 44 proximate the nub 40 of the contact embodiment previously described. When the contact 22 illustrated in FIGS. 1–5 is employed, a different type of element 76 would be seated in the trough 56 formed in the first, or upper, surface 34 of the housing 20. Rather than providing a rigid element 54, the element 76 which would be received in the trough 56 in the first surface 34 of the housing 20 in this embodiment would be elastomeric in nature and similar to the element 50 in the trough 58 formed in the second surface 36 of the housing 20. Both elements would, therefore, have a measure of compressibility and tensile extendibility rather than only one element having such compressibility and tensile extendibility, as is the case with the embodiment of FIGS. 6 and 7.

With both elements being elastomeric in nature, movement of both the protrusion 42 and the nub 40 of the contact 22 would still be able to occur along two mutually-perpendicular axes. That is, both the protrusion 42 and the hub of the contact 22 could move generally horizontally and vertically in view of the compressibility of the two elements. The embodiment of FIGS. 1–5, therefore, would also achieve the desired wiping action. At the same time, integrated circuit lead damage would be minimized, since the contact 22 is substantially free-floating in its suspension within the housing 20.

It will be understood that the response of the system can be controlled by varying the durometer rating of the element 76 received within the trough 56 formed within the upper surface 34 of the housing 20. The harder that the element 76 is, the more resistant it will be to lateral motion of the contact protrusion 42, and wiping action of protrusion 42 across the lead 30 of an integrated circuit 32 will be reduced. A typical durometer range is between 30 and 90 Shore D.

FIG. 3 illustrates the contact 22 of the embodiment of FIGS. 1–5 in its normal "rest" position. In this position, both elastomeric elements 50, 76 extend substantially linearly.

FIG. 5 illustrates the manner in which the elastomeric elements 50, 76 could be manipulated in order to effect mounting. FIG. 5 shows a contact 22 having been inserted upwardly through the bottom, second surface 36 of the housing 20 so that the protrusion 42 of the contact 22 passes between the two elastomeric elements 50, 76 and the hook portion 74 proximate the protrusion 42 of the contact 22 is positioned above the elastomeric element 76 received in the trough 56 formed in the first surface 34 of the housing 20.

The upper hook portion 74 then is brought downwardly to "catch" the elastomeric element 76 received in the trough 56 formed in the first surface 34 of the housing 20. FIG. 5 illustrates the contact 22 with such attachment to the elastomeric element 76 received in the trough 56 formed in the first surface 34 of the housing 20 being drawn downwardly to deform that element 76 so that the lower hook portion 44 can be brought into a disposition at which it can "catch" the elastomeric element 50 received in the trough 58 formed in the second surface 36 of the housing 20. When the lower hook portion 44 is brought into such a position, the contact 22 can be gradually released to effect catching of the elastomeric element 50 received in the trough 58 formed in the second surface 36 of the housing 20. After this occurs, the contact 22 and the elastomeric elements 50, 76 assume the positions illustrated in FIG. 3.

FIG. 4 illustrates the response of the assembly when the lead 30 of an integrated circuit 32 is brought into engagement with the protrusion 42 of the contact 22. As can be seen, the elastomeric element 76 received in the trough 56 formed in the first surface 34 of the housing 20 is deformed downwardly as it undergoes compression and tensile extension.

With the nub 40 of the contact 22 in engagement with the terminal 38 on the printed circuit board 28, there will be a deformation of the elastomeric element 50 received in the trough 58 formed in the second surface 36 of the housing 20. As seen in FIG. 4, this deformation will have an apparent upward movement.

In the embodiment illustrated in FIGS. 1–5, the printed circuit board 28 might, initially, be spaced from the second surface 36 of the housing 20. As the lead 30 of the integrated circuit device 32 is brought into engagement with the protrusion 42 of the contact 22 to urge the protrusion 42 downwardly, the lower extremity of the contact 22 (that is, the nub 40) will come into engagement with the terminal 38 of the printed circuit board 28. As continued downward movement of the protrusion 42 of the contact 22 occurs, co-related upward movement of,the nub 40 will result. This movement of the contact 22 will function to accomplish wiping and protection of the integrated circuit lead 30.

Figure 10:
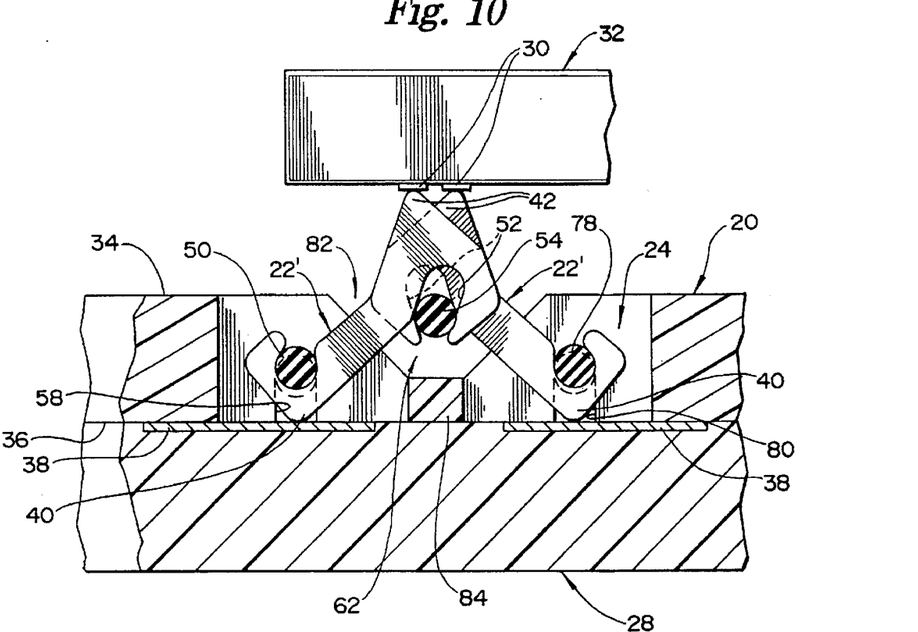
FIG. 10 is a fragmentary side elevational view with some parts cut away showing another embodiment of the invention.
Figure 11:
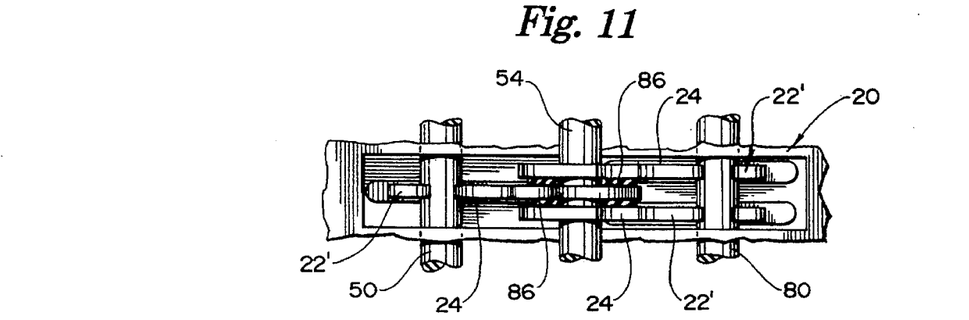
FIG. 11 is a fragmentary top view of the embodiment of FIG. 10.

FIGS. 10 and 11 illustrate an embodiment akin, in some respects, to the embodiment of FIGS. 6 and 7. In this embodiment, a rigid element 54 is employed and is received in the elongated channel 52 of each of a plurality of contacts 22'. In this embodiment, however, contacts 22' in adjacent slots 24 are staggered. That is, while one contact 22' extends to the left as seen in FIG. 10, the next contact 22' extends to the right.

It will be understood, and it is illustrated in FIGS. 10 and 11, that an additional elastomeric element 78 is provided, since hook portions 44 of the various contacts 22' in the array extend on two sides of the central, rigid element 54. In order to accommodate the additional elastomeric element 78, a second trough 80 is formed in the second surface 36 of the housing 20. The trough 80 would be spaced laterally from an intended location of the rigid element 54 substantially the same distance that the initial elastomeric element 50 is spaced in an opposite direction. As a result, the contact array will appear symmetrical. This arrangement is best seen in FIG. 10.

In the embodiment of FIGS. 10 and 11, a trough need not be provided in the first surface 34 of the housing 20 to receive the rigid element 54. Because of the oppositely coacting contacts, the rigid element 54 can be received in various elongated channels 52 in the contacts 22', and the reciprocal cooperation of the contact channels 52 will result in a jaw effect whereby the rigid element 54 is held in the channels 52.

Since a trough need not be provided for receipt of the rigid element, material need not be expended in forming the housing 20 at the location where the rigid element 54 is disposed. As seen in FIG. 10 then, a generally V-shaped recess 82 can be formed in the housing 20 with a central wall 84 extending upwardly from the second surface 36 of the housing 20 to separate left and right slots 24. Material from which the housing 20 as formed can, thereby, be conserved.

As seen in FIG. 11, the slots 24, typically, have an axial dimension greater than that of the respective contacts 22'. Consequently, there can be some play with the contacts 22' not being maintained in continuously defined planes. Since the contacts 22' are conductive in nature, insulative washers 86 can be disposed between adjacent contacts 22' along the rigid element 54. The axial dimension of the washers 86 can be such that play among the contacts 22' can be minimized.

FIG. 10 illustrates an integrated circuit device 32 with its leads 30 being brought into engagement with the protrusions 42 of the various contacts 22'. FIG. 10 illustrates those leads 30 as being spaced laterally in order to conform to the positions of the protrusion 42 of the contacts 22'. In fact, it will be understood that the slots 24 and respective contacts 22' received therein can be constructed in a manner so as to accommodate integrated circuits 32 structured in any particular fashion.

Figure 12:
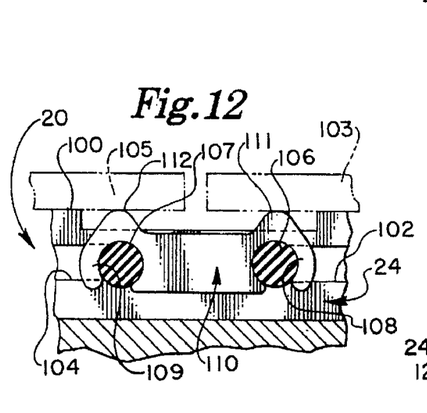
FIG. 12 is a fragmentary side elevational view with some parts cut away showing an alternative embodiment in which the lead and spaced terminal lie on a common side of the housing.
Figure 13:
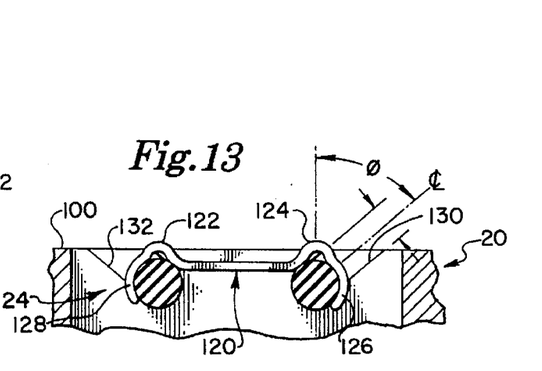
FIG. 13 is a fragmentary side elevational view with parts cut away showing an alternative contact design of the embodiment of FIG. 12.

Next referring to FIG. 12 and 13, an alternative embodiment is depicted. This alternative embodiment is directed to a specific design in which the apparatus is used for electrically interconnecting a lead of a device to a terminal spaced laterally at a distance from the lead on the same side of a housing. In this embodiment, the contact is designed with the hub and protrusion extending beyond a common planar surface 100 of the housing 20.

As depicted in FIG. 12, in this alternative embodiment, a housing 20, as previously described, having a slot, extending substantially parallel to an axis extending between a corresponding lead and spaced terminal, is provided. The housing 20 has a lateral surface (not shown), having a first trough 102 formed therein to extend proximate a lead 103. An opposite lateral surface (not shown) has a second trough 104 formed therein to extend proximate the spaced terminal 105.

A first elastomeric element 106 is received within the first trough 102. A second elastomeric element 107 is received in the second trough 104. Both elastomeric elements have a measure of compressibility and tensile extendibility.

A contact 110, which generally defines a plane, is received within the slot 24. The contact has a protrusion 111 extending outward from the surface 100 for engagement by the lead 103. The generally planar contact 110 also has a nub 112 extending outward from the surface 100 for engagement with the spaced terminal 105. Both the nub 102 and the protrusion 111 lie generally within the same plane in embodiment of FIG. 12.

FIG. 13 shows an embodiment similar to that of FIG. 12. The contact 120, however, is of a different design and is made from a spring form. The contact 110 of FIG. 12 includes a nub 112 and protrusion 111 which are integral extensions of the contact, as manufactured, proximate each of respective hook portions 108, 109. An example of integral extensions, is where, during the manufacture of the contact, the nub and protrusions are cut or formed from the contact material during manufacture such as stamping or cutting. In contrast, the contact 120 of FIG. 13 includes a nub 122 and protrusion 124 which are formed by bending the spring form contact proximate each of similarly formed hook portions 126, 128.

As with other embodiments, the protrusion is engaged by a lead and the first and second elastomeric elements function to permit movement of the contact in directions along two mutually perpendicular axes wherein beneficial wiping action of the protrusion across the lead and the nub across the spaced terminal occurs. It should be noted that, in the embodiment illustrated in FIG. 13, the troughs 130, 132 in which the elastomeric elements are received are formed into the housing entering from surface 100 but at an angle thereto. The angles of entry are such that, when the contact 120 is hooked over the elastomeric elements, those elements will be retained within troughs 130, 132.

Regardless of the embodiment of the invention, the housing 20 is substantially the same, varying only based upon the intended location of the contacts 22', 110, 120 and the location of trough entry. The housing 20 can be fabricated by forming the slots 24 with either laser machining (typically, for prototyping and small production quantities) or injection molding of the overall housing 20 with slots 24 formed therein (typically, for economic production quantities). Contacts 22, 22', 110, 120 can be suspended in a manner previously discussed. As one will perceive, contacts 22, 22', 110, 120 are individually replaceable.

The contacts 22, 22', 110, 120 are designed to provide very short electrical paths. Typically, the overall length of a contact would not exceed 0.14 inches. In contacts in accordance with the present invention, such a length translates into a 2.0 nanohenries inductance between surfaces. As a result, very high digital signals (typically greater than 5 gigahertz) can be transmitted without any significant loss of fidelity. Since the areas of the contacts 22, 22', 110, 120 which actually engage integrated circuit device leads 30 and printed circuit board terminals 38 is minimal, the amount of cross-talk between signal lines will also be minimal. This will provide for higher isolation of transmitted analog signals.

Figures 14, 16:
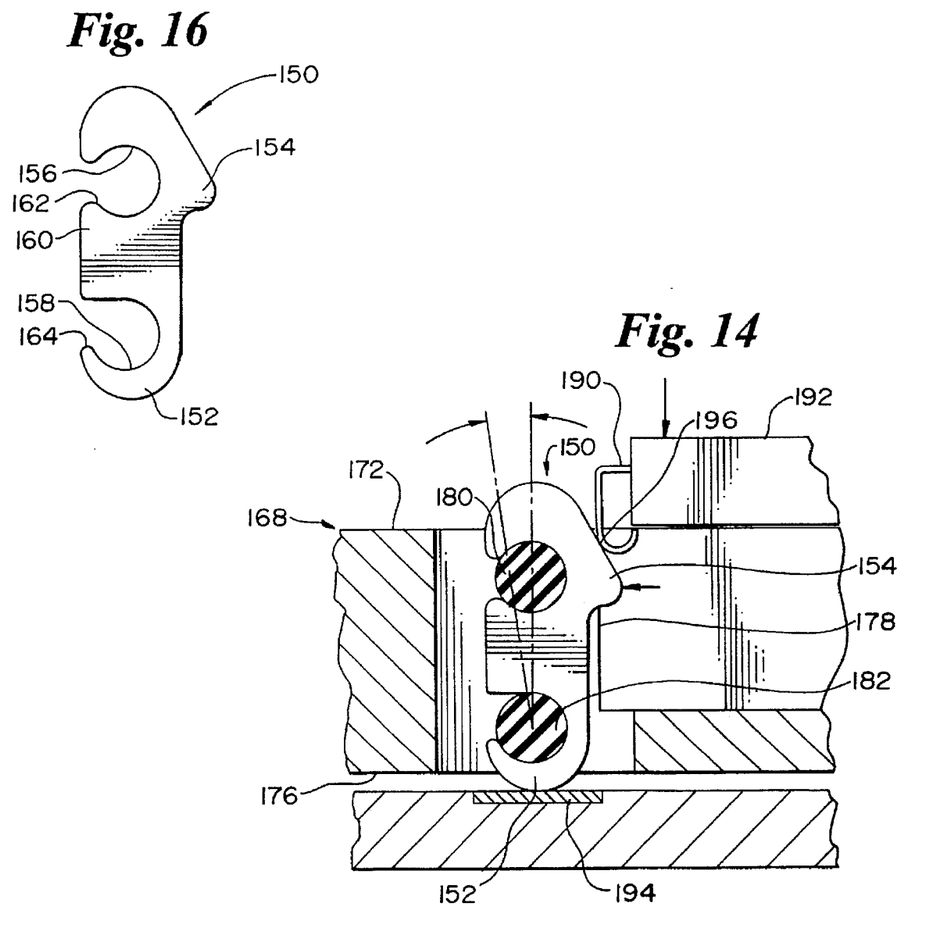
FIG. 14 is a fragmentary side elevational view of another embodiment of the invention with some parts cut away.
FIG. 16 is a side view of an individual contact of the embodiment shown in FIGS. 14–15.
Figure 15:
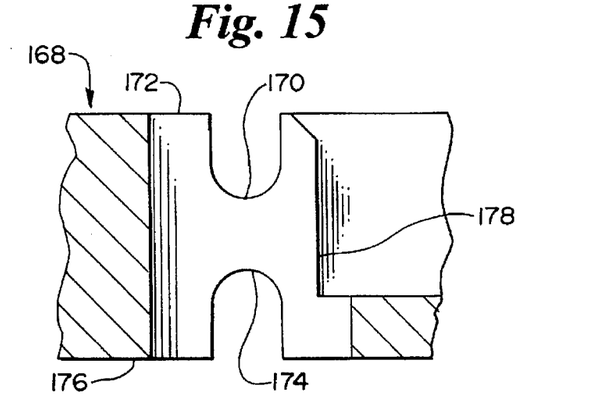
FIG. 15 is a fragmentary side elevational view of the housing shown in FIG. 14 with some parts cut away.

FIGS. 14–16 show another embodiment of the present invention. The housing of the present embodiment is similar to the housing shown in FIG. 1 except that the first trough and the second trough are aligned as shown in FIG. 15. That is, a first trough 170 may be formed in the first surface 172 of housing 168 and a second trough 174 may be formed in the second surface 176 of housing 168. The first trough 170 may be substantially aligned with the second trough 174 such that the first trough 170 and the second trough 174 may intersect a plane which is normal to the first surface 172 and the second surface 176 of the housing 168. In many other respects, the housing 168 may be similarly constructed to that shown and described in FIG. 1. For example, a plurality of slots may be provided therein for receiving a plurality of integrated circuit device leads. One such slot is shown at 178 of FIG. 15.

A first elastomeric elongated element 180 may be placed in the first trough 170, and a second elastomeric elongated element 182 may be placed in the second trough 174. In an exemplary embodiment, it is contemplated that the second elongated element 182 may be constructed from a material having a higher durometer rating than that of the first elastomeric elongated element 180 and still be within the scope of the present invention.

The contact 150 of the present embodiment may be of a different design than that shown in FIGS. 6–7. The contact of the present embodiment is generally shown at 150. Contact 150 may include a nub 152 extending downward from the second surface 176 of the housing 168 for engagement of the spaced terminal and a protrusion 154 extending into a slot 178 in the housing 168 for engagement of the lead. The nub 152 and the protrusion 154 may be integral extensions of the contact 150, as manufactured, wherein the nub 152 may be positioned near the lower portion of the contact 150 and the protrusion 154 may be positioned near an upper-side portion of the contact 150.

The protrusion 154 may be adjacent to a first hook member 156. A second hook member 158 may be positioned below the first hook member 156 but above the nub 152. The first hook member 156 and the second hook member 158 may each have an opening 162 and 164, respectively. Openings 162 and 164 may open to the opposite side of the contact 150 as the protrusion 154. Further, the first hook member 156 may be separated from the second hook member 158 by a contact center portion 160. The first hook member 156 may capture the first elastomeric elongated element 180 and the second hook member 158 may capture the second elastomeric elongated element 182. The contact 150 would, therefore, latch onto the first elastomeric elongated element 180 and the second elastomeric elongated element 182. The first and second elastomeric elongated elements may hold the contact in place, as previously disclosed.

As a particular lead 190 of an integrated circuit device 192 engages the protrusion 154 of a corresponding contact 150 and exerts downward pressure upon the protrusion 154, the contact 150 may move relatively to the first elastomeric elongated element 180 and the second elastomeric element 182 captured therein, and the contact 150 may, effectively, be made to rotate to some extent as a result of the first elastomeric elongated element 180 deforming laterally away from the lead 190 of the integrated circuit 192. That is, the downward force exerted by the lead 190 of the integrated circuit 192 upon the contact 150 may have components along both X and Y axes, and these components may effect the apparent rotation of the contact 150. As a result, the protrusion 154 will move laterally to some degree across the surface 196 of the integrated circuit lead 190 by which it is engaged, and the nub 152 of the contact 150 may move laterally across the integrated circuit board terminal 194 with which it is in contact. It is contemplated that the second elastomeric elongated element 182 may be constructed from a material having a higher durometer rating than that of the first elastomeric elongated element 180 and still allow the apparent rotation of contact 150.

Figures 17, 18, 19:
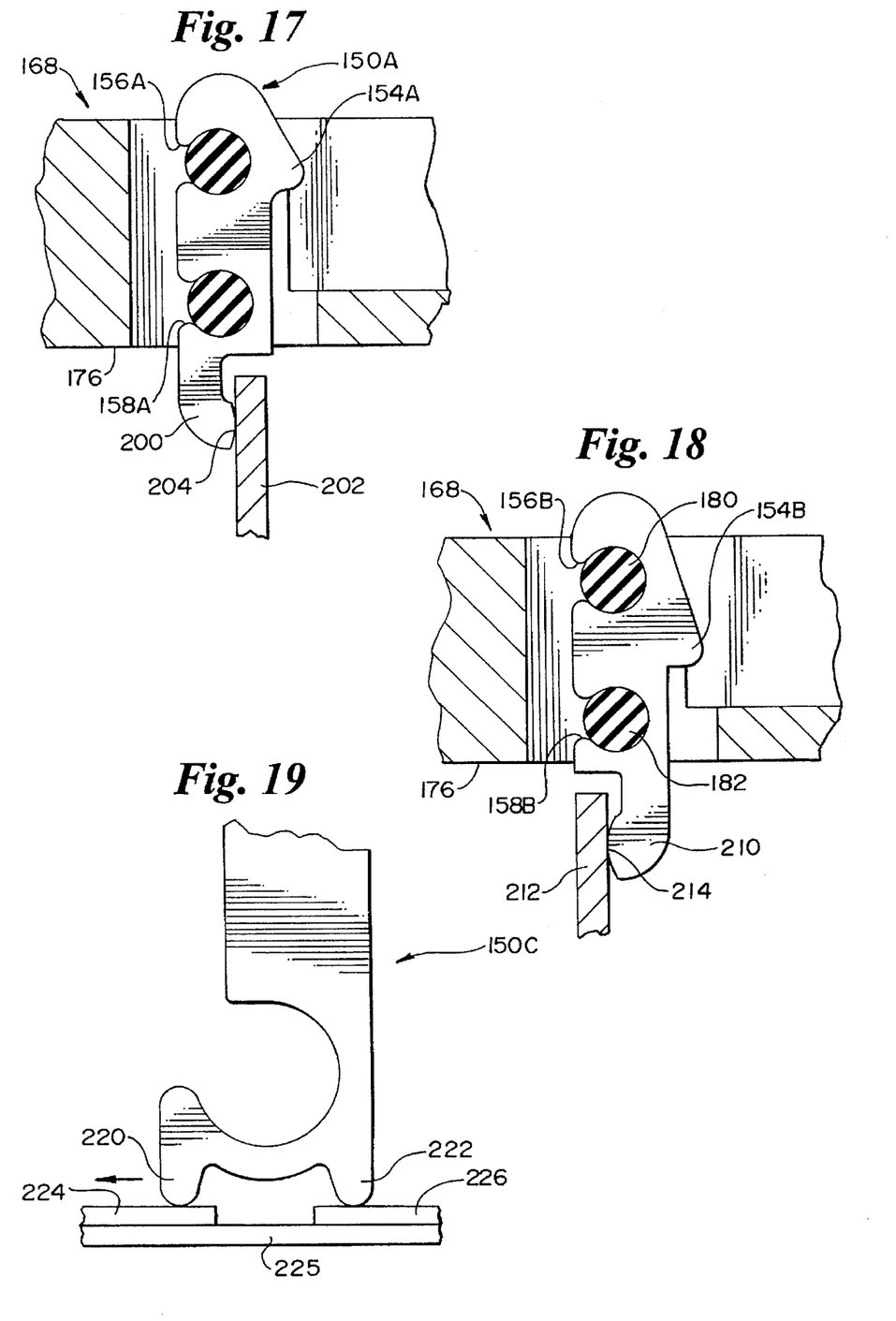
FIG. 17 is a fragmentary side elevational view of another embodiment of the invention with some parts cut away.
FIG. 18 is a fragmentary side elevational view of yet another embodiment of the invention with some parts cut away.
FIG. 19 is a side view of a lower portion of an individual contact of another embodiment of the invention.

Another embodiment of the present invention is shown in FIG. 17. This embodiment is similar to the embodiment shown in FIGS. 14–16, but a contact 150A may have an elongated nub 200 extending downward from the second surface 176 of the housing 168. An integrated circuit board terminal 202 may be positioned to engage a side 204 of the elongated nub 200 opposite the first and second hook members 156A and 158A. In this embodiment, as in the previously described related embodiment, the downward force exerted by the lead of the integrated circuit upon the contact 150A will have components along both X and Y axes, and these components will effect the apparent rotation of the contact 150A. As a result, the protrusion 154A may move laterally to some degree across the surface of the integrated circuit lead by which it is engaged. Further, the extended nub 200 of the contact 150A may tend to move laterally with respect to the integrated circuit board terminal 202 thereby applying increased force thereon. The apparent rotation of the contact 150A may also cause the elongated nub 200 to move somewhat vertically across the integrated circuit board terminal 202 thereby providing a wiping action thereto.

In another embodiment of the present invention as shown in FIG. 18, a contact 150B may have an elongated nub 210 extending down from the second surface 176 of the housing 168 as previously described. However, the integrated circuit board terminal 212 may be positioned to engage a side 214 of the elongated nub 210 which is adjacent to the first and second hook members 156B and 158B. Further, the protrusion 154B on the contact 150B may be positioned lower on the contact body such that a corresponding integrated circuit lead contacts the protrusion between the first elastomeric elongated element 180 and the second elastomeric elongated element 182. In this embodiment, the downward force exerted by the lead of the integrated circuit upon the contact 150B will have a component along primarily the X axis, and this component will effect the apparent lateral movement of the contact 150B. As a result, the extended nub 210 of the contact 150B may tend to move laterally with respect to the integrated circuit board terminal 212 thereby applying increased force thereon.

It is contemplated that the elongated nub 210 of the contact 150B in the previously described embodiment may be replaced with a first nub 220 and a second nub 222 as shown in FIG. 19. The first nub 220 and the second nub 222 may extend downward from the second surface 176 of the housing 168 for engagement of a first integrated circuit board terminal 224 and a second integrated circuit board terminal 226, respectively. The first and second integrated circuit board terminals 224 and 226 may be on a PC board 225. As described above, the protrusion 154B on the contact 150B may be positioned lower on the contact body such that the integrated circuit lead contacts the protrusion 154B between the first elastomeric elongated element 156B and the second elastomeric elongated element 158B. In this embodiment, the downward force exerted by the lead of the integrated circuit upon the contact 150C will have a component along primarily the X axis, and this component will effect the lateral movement of the contact 150C. As a result, the first nub 220 and the second nub 222 of the contact 150C tend to move laterally with respect to the first integrated circuit board terminal 224 and the second integrated circuit board terminal 226, respectively, thereby providing a wiping action thereto while maintaining contact therewith. This multi-contact 150C embodiment may provide a means for programming a corresponding PC board by selectively using the multi-contact 150C in combination with single-contacts 150. For example, the multi-contact 150C configuration may be used to bridge two signal traces 224 and 226. A test board may be programmed by selecting a multi-contact 150C when two corresponding traces are to be bridged and by selecting a single-contact 150 when two corresponding contacts are not to be bridged. This allows a PC board to be customized by selecting the appropriate combination of multi-contacts 150C and single-contacts 150, rather than providing a new PC board for each application. The multi-contact 150C may also provide a more reliable contact.

As stated above, regardless of the embodiment of the invention, the housing 168 may be substantially the same, varying only based upon the intended location of the contacts 22', 110, 120, 150, 150A, 150B, 150C and the location of trough entry. The housing 168 can be fabricated by forming slots 178 with either laser machining (typically, for prototyping and small production quantities) or injection molding of the overall housing 168 with slots 178 formed therein (typically, for economic production quantities). Contacts 22, 22', 110, 120, 150, 150A, 150B, 150C can be suspended in a manner previously discussed. As one will perceive, contacts 22, 22', 110, 120, 150, 150A, 150B, 150C are individually replaceable.

Further, the contacts 22, 22', 110, 120, 150, 150A, 150B, 150C are designed to provide very short electrical paths. Typically, the overall length of a contact would not exceed 0.14 inches. In contacts in accordance with the present invention, such a length translates into a 2.0 nanohenries inductance between surfaces. As a result, very high digital signals (typically greater than 5 gigahertz) can be transmitted without any significant loss of fidelity. Since the areas of the contacts 22, 22', 110, 120, 150A, 150B, 150C which actually engage integrated circuit device leads 190 and printed circuit board terminals 194 is minimal, the amount of cross-talk between signal lines will also be minimal. This will provide for higher isolation of transmitted signals.

Finally, as discussed above, a plurality of slots, each receiving a contact, may be provided. Typically, a multiplicity of contacts are employed, one for each integrated circuit lead. In such an embodiment, the printed circuit board is provided with a plurality of terminals, each being in engagement with one of the ganged contacts.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined in the language in which the appended claims are expressed.

What is claimed is:

1. Apparatus for electrically interconnecting a lead of a device to a terminal spaced at a distance from the lead, comprising:

(a) a housing, said housing having at least one contact receiving slot formed therein, said housing having a surface intersected by said at least one contact receiving slot, said at least one contact receiving slot extending substantially parallel to an axis extending between a corresponding lead and spaced terminal;

(b) a first elastomeric element carried by said housing such that said first elastomeric element extends across the at least one contact receiving slot;

(c) a second elastomeric element carried by said housing such that said second elastomeric element extends across the at least one contact receiving slot; and (d) a contact received within said at least one contact receiving slot, said contact engagable by the lead and further engagable by the spaced terminal, said contact capturing, and being suspended by, said first elastomeric element and said second elastomeric element, wherein said contact comprises a first hook member for capturing said first elastomeric element and a second hook member for capturing said second elastomeric element, wherein said first hook member of said contact encircles said first elastomeric element to hold said contact to said first elastomeric element, wherein said second hook member of said contact encircles said second elastomeric element to hold said contact to said second elastomeric element, wherein said contact comprises a protrusion for contacting the lead, and a nub for contacting the spaced terminal, wherein said protrusion is positioned proximal said first hook member such that, as said contact is engaged by the lead, said first elastomeric element deforms to permit relative rotation of said contact, thereby providing wiping action of said protrusion across the lead of the device and said nub across said spaced terminal, and wherein said nub comprises an elongated hub extending downward, said spaced terminal contacting a side of said elongated nub, said side being adjacent to said protrusion, as said contact is engaged by the lead, said first elastomeric element deforms to permit relative rotation of said contact, thereby providing wiping action of said protrusion across the lead of the device, said relative rotation further providing increased force and a wiping action by said extended nub to said spaced terminal;

(e) wherein, as said contact is engaged by the lead, at least one of said first and second elastomeric elements deforms to permit movement of said contact.

2. Apparatus in accordance with claim 1, wherein said first elastomeric element is constructed from a material that is less deformable than said second elastomeric element.

3. Apparatus in accordance with claim 1, wherein said second elastomeric element is constructed from a material that is less deformable than said first elastomeric element.

4. Apparatus in accordance with claim 1 wherein, as said contact is engaged by the lead, said first elastomeric element deforms to permit relative rotation of said contact.

5. Apparatus in accordance with claim 1 wherein, as said contact is engaged by the lead, said first and second elastomeric elements deform to permit lateral movement of said contact.

6. Apparatus in accordance with claim 1 wherein said housing has a first trough formed therein proximate the lead and a second trough formed therein proximate the spaced terminal, said first trough receiving said first elastomeric element and said second trough receiving said second elastomeric element.

7. Apparatus in accordance with claim 6 wherein said first trough and said second trough intersect a plane which is normal to said surface of said housing.

8. Apparatus in accordance with claim 7, wherein said nub and said protrusion on said contact are integral extensions of said contact.

9. Apparatus for electrically interconnecting a lead of a device to a terminal spaced at a distance from the lead, comprising:

(a) a housing, said housing having at least one contact receiving slot formed therein, said housing having a surface intersected by said at least one contact receiving slot, said at least one contact receiving slot extending substantially parallel to an axis extending between a corresponding lead and spaced terminal;

(b) a first elastomeric element carried by said housing such that said first elastomeric element extends across the at least one contact receiving slot;

(c) a second elastomeric element carried by said housing such that said second elastomeric element extends across the at least one contact receiving slot; and (d) a contact received within said at least one contact receiving slot, said contact engagable by the lead and further engagable by the spaced terminal, said contact capturing, and being suspended by, said first elastomeric element and said second elastomeric element, wherein said contact comprises a first hook member for capturing said first elastomeric element and a second hook member for capturing said second elastomeric element, wherein said first hook member of said contact encircles said first elastomeric element to hold said contact to said first elastomeric element, wherein said second hook member of said contact encircles said second elastomeric element to hold said contact to said second elastomeric element, wherein said contact comprises a protrusion for contacting the lead, and a nub for contacting the spaced terminal, and wherein said protrusion is positioned between said first hook member and said second hook member such that, as said contact is engaged by the lead, said first and second elastomeric elements deform to permit lateral movement of said contact, thereby providing wiping action of said protrusion across the lead of the device and said nub across said spaced terminal;

(e) wherein, as said contact is engaged by the lead, at least one of said first and second elastomeric elements deforms to permit movement of said contact.

10. Apparatus in accordance with claim 9, wherein said nub comprises an elongated nub extending downward, said spaced terminal contacting a side of said elongated nub, said side being opposite to said protrusion, as said contact is engaged by the lead, said first and second elastomeric elements deform to permit lateral movement of said contact thereby providing wiping action of said protrusion across the lead of the device, said lateral movement further providing increased force by said extended nub to said spaced terminal.

11. Apparatus in accordance with claim 9 wherein said nub comprises a first nub and a second nub, said first nub contacting a first spaced terminal and said second nub contacting a second spaced terminal, as said contact is engaged by the lead, said first and second elastomeric elements deform to permit lateral movement of said contact thereby providing wiping action of said protrusion across the lead of the device, said lateral movement further providing wiping action of said first and second nubs across said first and second spaced terminals, respectively.

12. Apparatus in accordance with claim 11 wherein said contact having said first nub and said second nub may be selectively used to program a corresponding PC board.

* * * * *